United States Patent
Bellorado et al.

(10) Patent No.: US 8,560,900 B1
(45) Date of Patent: Oct. 15, 2013

(54) ADJUSTING RECEIVER PARAMETERS WITHOUT KNOWN DATA

(75) Inventors: Jason Bellorado, Santa Clara, CA (US); Marcus Marrow, Santa Clara, CA (US); Yu Kou, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 293 days.

(21) Appl. No.: 13/160,360

(22) Filed: Jun. 14, 2011

Related U.S. Application Data (60) Provisional application No. 61/397,776, filed on Jun. 15, 2010.

(51) Int. Cl.
*G11C 29/00* (2006.01)
*G06F 11/00* (2006.01)
*G06F 9/455* (2006.01)
*G01R 31/30* (2006.01)

(52) U.S. Cl.
USPC .............. 714/718; 714/741; 714/745; 703/25

(58) Field of Classification Search
USPC ......... 714/718, 741, 745, 746, 752, 758, 786, 714/795; 703/3, 13, 14, 23, 25; 365/200, 365/201
See application file for complete search history.

(56) References Cited

U.S. PATENT DOCUMENTS

| 7,158,567 B2 * | 1/2007 | Wang et al. ................... 375/232 |
| 8,300,563 B2 * | 10/2012 | Krishnaswamy et al. ..... 370/310 |
| 2005/0005225 A1 * | 1/2005 | Johnson et al. ............... 714/758 |
| 2008/0276156 A1 | 11/2008 | Gunnam et al. |
| 2008/0301521 A1 | 12/2008 | Gunnam et al. |

* cited by examiner

*Primary Examiner* — Christine Tu
(74) *Attorney, Agent, or Firm* — Van Pelt, Yi & James LLP (57) ABSTRACT

Adjusting receiving parameters without known data is disclosed, including: receiving an indication of whether data associated with a sector is error correcting code (ECC) uncorrectable; in the event that the indication is that the data is uncorrectable, determining a plurality of statistical information outputs using a detector; and using at least a subset of the plurality of statistical information outputs to adjust a set of one or more receiver parameters.

20 Claims, 9 Drawing Sheets

ADJUSTING RECEIVER PARAMETERS WITHOUT KNOWN DATA

CROSS REFERENCE TO OTHER APPLICATIONS

This application claims priority to U.S. Provisional Patent Application No. 61/397,776 entitled OBTAINING EQUALIZATION AND/OR DETECTION PARAMETERS WHICH MINIMIZE THE ERROR-EVENT PROBABILITY OF A DIGITAL RECEIVER WITHOUT THE USE OF KNOWN DATA filed Jun. 15, 2010 which is incorporated herein by reference for all purposes.

BACKGROUND OF THE INVENTION

The performance of some systems is dictated by the parameter values selected for the components of that system. For some systems (e.g., hard disk systems), the parameters of a receiver can be adjusted based on known data to improve performance. However, in some scenarios, there is no known data from which to optimize the parameter values of a receiver. Therefore, techniques for adjusting the parameters in such cases would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
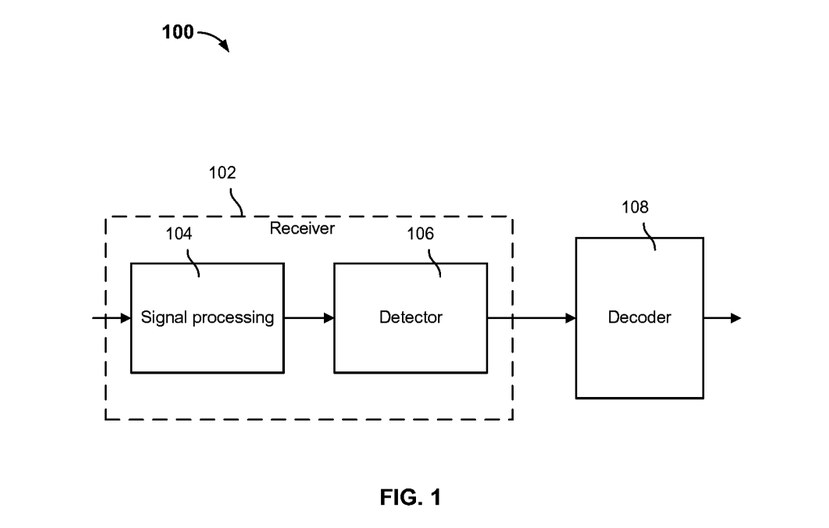
FIG. 1 is a diagram showing an embodiment of a receiver including a decoder.

FIG. 1 is a diagram showing an embodiment of a receiver including a decoder.

The performance of some systems is dictated by the parameter values selected for the components of that system. For example, in the case of a read channel (which accesses data stored in a hard disk system and performs error correction on the read data), some example parameters include the taps of a Finite Impulse Response (FIR) filter, the taps of a target, the branch levels of a Viterbi decoder, etc. Typically, a newly manufactured system is programmed with a set of parameter values (or sets of parameter values) that were determined based on iterations of testing.

For some systems (e.g., hard disk systems), the parameters of a receiver can be adjusted with respect to error-event rate as a figure-of-merit. For example, gradients are formulated for each of the receiver's parameters, which are used to incrementally adjust the parameter values upon the occurrence of error-events or near error-events. Typically, some form of known data is used to determine the sign of the gradient. Whereas parameter adjustment in the correct direction (e.g., as specified by the known data) acts to minimize the probability of an error or near error event, parameter adjustment in the incorrect direction will act to maximize the probability of an event's occurrence. Examples of known data include a known pattern (e.g., a training data sequence) or an output of a decoder that utilizes error-correction code. Error events (and near error events) could then be defined to occur when the difference between a metric associated with the detected sequence and the true, written/transmitted (i.e., known data) sequence falls within a defined range. Based on such detected error events computed using known data, the parameter values can be adjusted to reduce the probability of error or near error events (e.g., for subsequent rounds of detection).

However, in some scenarios, there is no known data from which to optimize the parameter values of a receiver. For hard disk systems, an example of where there is no known data is when a sector of the hard disk to be read by a read channel is determined to be error-correction code (ECC) uncorrectable. In such an event, using ECC correctable data is not possible and training cannot be conducted because re-creating such a condition is not realistic. Sometimes, when a sector is determined to be ECC uncorrectable, the sector will be repeatedly re-read until it can be corrected. Nevertheless, in magnetic recording systems, for example, over 90% of noise does not change from read-to-read and therefore, only a small fraction (less than 10%) of the noise power will change from read-to-read. So essentially, re-reads will be somewhat equivalent. Techniques to adjust the parameter values of the receiver to make the recovery of a sector more likely on re-reads are disclosed.

Referring to FIG. 1, in some embodiments, system 100 is associated with a hard disk system. In some embodiments, the receiver is associated with the read channel of a hard disk system. In some embodiments, system 100 is used to perform a read operation on a hard disk and/or interface with a hard disk controller. In the example shown, receiver 102 includes at least signal processing 104 and detector 106. Signal processing 104 can include, for example, an analog-to-digital converter and one or more filters (e.g., FIR). Detector 106 can include, for example, a Viterbi detector (e.g., a soft output Viterbi algorithm, or SOVA, detector). In various embodiments, detector 106 can correct errors introduced by the noise of the read channel, for example. In various embodiments, detector 106 can output (at least) soft decisions (e.g., decision data sequences/paths with corresponding reliability information such as statistical information) and/or possible error event information (e.g., portion(s) of the decision data sequence that are representative of symbol errors). Decoder 108 can include, for example, a decoder that uses a low-density parity-check (LDPC) code. In various embodiments, decoder 108 can output (at least) hard decoding decisions such as whether a error correction code word for a detected data sequence can be decoded (e.g., based on one or more parity checks).

For example, system 100 is used to perform a read operation on a sector (e.g., which includes 40,000 bits) of a hard disk. Signal processing 104 is performed on the received sample data (e.g., a continuous waveform) and detector 106 receives the processed sample data to produce a decision data sequence (e.g., one or more bits) and one or more statistical information outputs (e.g., relating to the reliability along one or more portions of the decision data sequence). Next, decoder 108 determines whether an error correction code word can or cannot be determined for the decision data sequence. If the code word can be determined, then it is determined that the read operation is successfully performed on the sector and that the data associated with the sector can be recovered. However, if the code word cannot be determined (e.g., one or more bits of the sector are unreadable), then it is determined that the sector is ECC uncorrectable. A sector can become ECC uncorrectable when, for example, an adjacent sector is written numerous times which acts to partially erase the sector of interest. In the event of an ECC uncorrectable sector, a re-read operation can be performed on the sector to recover its associated data.

As a disclosed herein, one or more parameters associated with the receiver can be adjusted to improve the probability that a subsequent re-read operation could recover data associated with an ECC uncorrectable error (e.g., when there is no known data to use to adjust receiver parameter values). For example, by adjusting one or more parameter values associated with the receiver, the read channel of a hard disk system could output a different decision data sequence (than one produced prior to the adjustment) that is more likely to be successfully decoded (e.g., become ECC correctable).

Figure 2:
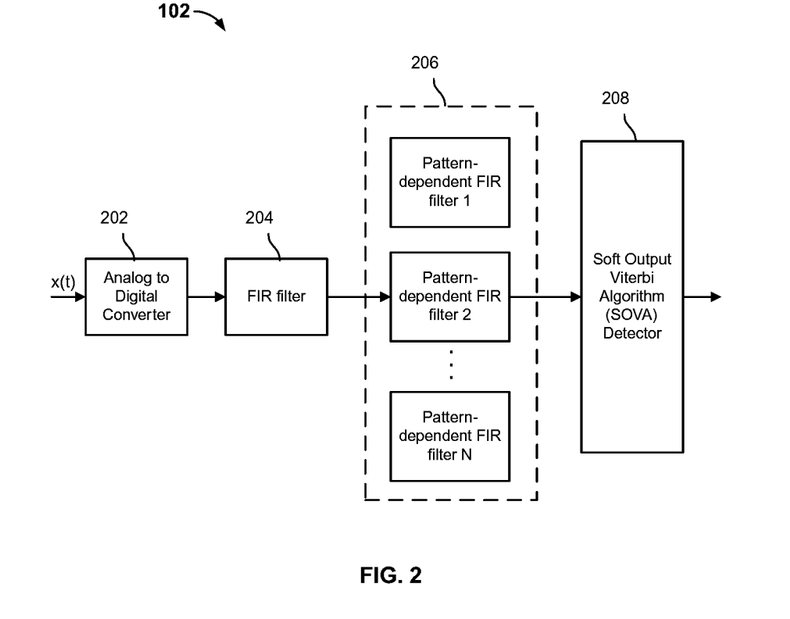
FIG. 2 is an example of components associated with a receiver for which parameters can be adjusted without known data.

FIG. 2 is an example of components associated with a receiver for which parameters can be adjusted without known data. In some embodiments, the example of FIG. 2 can be used to implement, at least in part, receiver 102 of FIG. 1. In some embodiments, one or more parameters associated with the receiver includes parameters associated with analog-to-digital converter (ADC) 202, finite impulse response (FIR) filter 204, parallel bank of N pattern dependent FIR filters 206, and/or soft output Viterbi algorithm (SOVA) detector 208. In the event that a sector is determined to be ECC uncorrectable, the values of the parameters associated with one or more of the shown components of receiver 102 can be adjusted to make the detected sequence (produced by SOVA detector 208) more probable to be ECC correctable for a subsequent re-read of the sector.

In the example shown, a received data sample (e.g., that is read from a sector of a hard disk) is passed through ADC 202, which produces a sampled data vector from a continuous-time, continuous-amplitude, waveform x(t). The sampled data vector is passed to FIR filter 204, which is also referred to as an equalizer. FIR 204 produces an equalized waveform vector, which is passed to parallel bank of N pattern dependent FIR filters 206 to produce N parallel data streams, which are input to SOVA 208.

Figure 3:
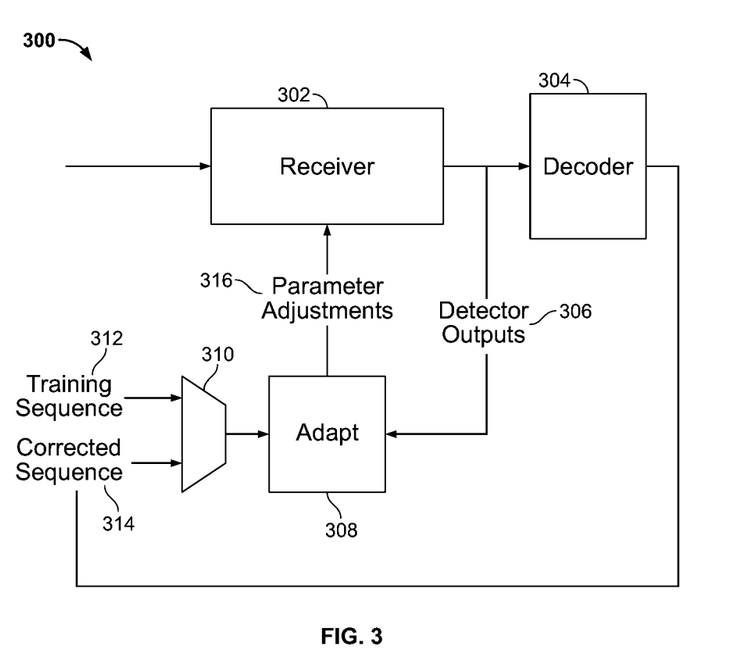
FIG. 3 is a diagram showing an example of a system for updating system parameters based on using known data.

FIG. 3 is a diagram showing an example of a system for updating system parameters based on using known data. In some embodiments, receiver 302 can be implemented with the example of FIG. 2. In the example of FIG. 3, receiver 302 can be thought of as being programmed with a set of initial parameter values. In the example of FIG. 3, at receiver 302, received sample data (e.g., a continuous waveform) is signal processed and passed through a detector. The output of receiver 302 includes detector outputs 306 such as a decision sequence and possibly other information (e.g., reliability information). Decision sequence (sometimes referred to as a decision path) of detector outputs 306 includes one or more bits to be potentially decoded by decoder 304 to become the recovered data.

In some embodiments, the decision sequence of detector outputs 306 and one or both of training sequence 312 and corrected sequence 314 are used to adjust the parameter values associated with receiver 302. In this example, both training sequence 312 and corrected sequence 314 are each considered to be known data. In various embodiments, known data refers to data that is presumed to be (or very close to) the true/correct transmitted/written data. Training sequence 312 can include, for example, a sequence written (e.g., by an administrator in charge of adjusting the parameters of the receiver) based on the true/correct transmitted/written data. Corrected sequence 314 is a sequence of recovered data produced from a decision sequence (output at some prior point in time) that was successfully decoded (e.g., using a low-density parity-check code or Turbo code, or other coding scheme with a low probability of mis-correction). The known data (e.g., whichever of training sequence 312 or corrected sequence 314 is chosen by multiplexer 310) is input into adapt block 308 along with the decision sequence of detector outputs 306. Adapt block 308 can produce figures-of-merit, which are based on, for example, differences in a metric associated with a data sequence associated with the known data and a metric associated with decision sequence of detector outputs 306. Adapt block 308 is configured to generate (at least) parameter adjustments 316 to update receiver 302 parameters based at least on some error-events or near error events that correspond to the produced figures-of-merit. Parameter adjustments 316 can be used to augment parameter values (e.g., filter taps, SOVA parameters) associated with receiver 302 such that when a subsequent sample data is processed by receiver 302, the resulting bit error rate will be reduced. However, in order to update parameters of receiver 302, some form of known data (e.g., training sequence 312 or corrected sequence 314) is needed to be input into adapt block 308.

What would be helpful is to be able to update the parameters of receiver 302 without requiring the use of known data, as further described below.

Figure 4:
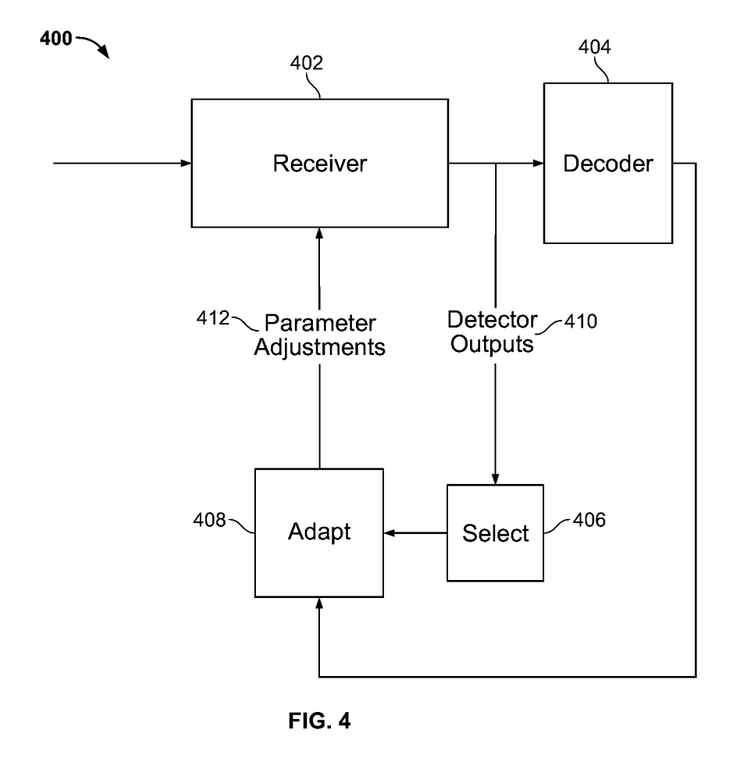
FIG. 4 is a diagram showing an embodiment of a system for updating system parameters without the use of known data.

FIG. 4 is a diagram showing an embodiment of a system for updating system parameters without the use of known data. In some embodiments, receiver 402 can be implemented with the example of FIG. 2. In the example of FIG. 4, at receiver 402, received sample data (e.g., a sampled continuous waveform) is signal processed and passed through a detector. The output of receiver 402 includes detector outputs 410 such as a decision sequence and one or more statistical information outputs. In some embodiments, a statistical information output (e.g., $\Delta$) is one or more of the following: the difference between two path metrics associated with an instance in time of the trellis diagram, the difference between two path metrics associated with a state along the decision sequence, and the difference between two path metrics associated with two candidate sequences (e.g., one surviving path and one non-surviving path) considered by the Viterbi detector. Decision sequence (sometimes referred to as a decision path) of detector outputs 410 includes one or more bits to be potentially decoded by decoder 404 to become the recovered data.

In some embodiments, system 400 can be used to adjust the parameters of receiver 402 when known data (e.g., training sequence 312 or corrected sequence 314 of FIG. 3) are not available. An example scenario when known data is not available is when detector outputs 410 (for a read operation associated with a sector of a hard disk) is not ECC correctable by decoder 404, such as when detector outputs 410 are not sufficient to allow the ECC to correctly determine the written code word (e.g., using a low-density parity-check code or Turbo code, or some other coding scheme with a low probability of mis-correction). Due to this event of an ECC uncorrectable sector, the sector may be re-read until the outputs produced by the detector (of receiver 402) are ECC correctable. Parameter values associated with receiver 402 can be adjusted to increase the likelihood that a subsequent re-read operation on the sector will yield ECC correctable detector outputs.

Since known data is not available (due to the initial ECC uncorrectable condition of the sector which precludes the use of a training sequence and/or a correctable decision sequence), one or more statistical outputs of the detector of receiver 402 can be used to adjust the parameter values of receiver 402. In some embodiments, detector outputs 410 are input into select block 406. Select block 406 is configured to choose a subset of the statistical information outputs from those included in detector outputs 410 to input into adapt block 408. In some embodiments, a subset of the statistical information outputs is chosen based on the presumption that statistical information outputs with small magnitudes correspond to error events (e.g., symbols that were incorrectly detected by the detector). For example, in choosing a subset of the statistical information outputs, one or both of the following processes can be used: (1) sorting the statistical information outputs by their magnitude and choosing a predetermined number of them from the end of the sorted list associated with the smallest magnitude (2) choosing the statistical information outputs that are below a predetermined threshold. Then, the chosen statistical information outputs are input into adapt block 408 for adapt block 408 to process the error events that correspond to the chosen statistical information outputs. In various embodiments, select block 406 and adapt block 408 are implemented using one or both of software and hardware. For example, for each processed error event, adapt block 408 can generate a new set of parameter adjustments 412 (e.g., a set of increment values by which the current set of parameter values can be adjusted) to use to update the parameter values of receiver 402. In some embodiments, subsequent to one or more iterations of adjusting parameter values of receiver 402, a re-read operation can be performed on the same sector (that was initially determined to be ECC uncorrectable) to potentially produce detector outputs that are ECC correctable by decoder 404. In some embodiments, the current read may be processed with the newly adjusted parameters to determine if the sector is now ECC correctable.

Figure 5:
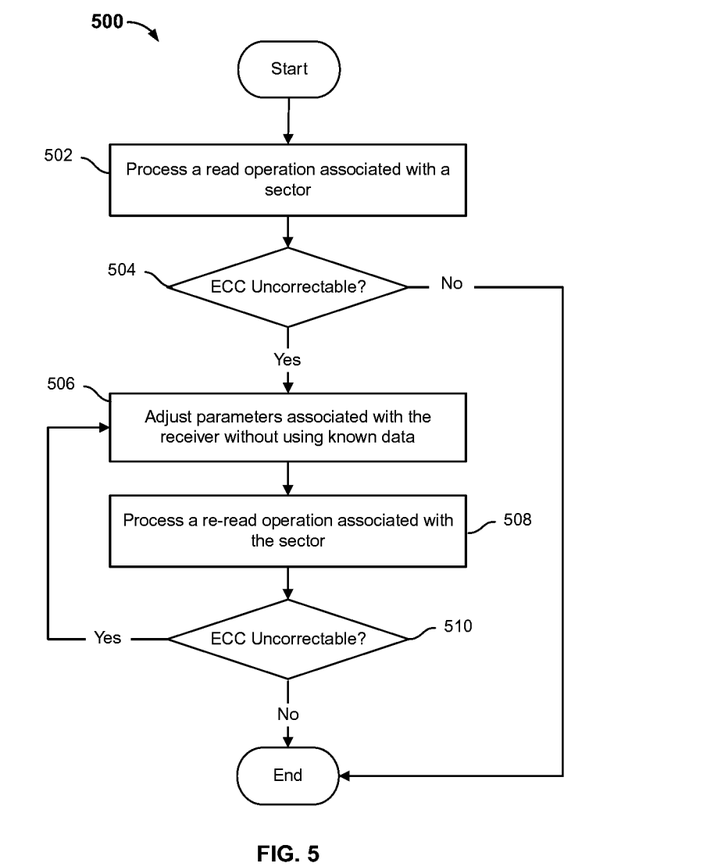
FIG. 5 is a flow diagram showing an embodiment of adjusting system parameters without the use of known data.

FIG. 5 is a flow diagram showing an embodiment of adjusting system parameters without the use of known data. In some embodiments, process 500 can be implemented, at least in part, by using system 400. In some embodiments, the process is performed by some test or manufacturing equipment, for example at the factory or some post manufacturing test facility. In some embodiments, the process is performed in real time. In some embodiments, the system being processed is a hard disk system and the system parameters being determined and programmed are associated with the read channel of a hard disk system.

At 502, a read operation associated with a sector is processed. In some embodiments, the sector is associated with a sector of a hard disk. In some embodiments, the data read from the sector is input into a receiver (e.g., receiver 402) and a decision sequence and one or more statistical information outputs are produced.

At 504, it is determined whether the sector is error correction code (ECC) uncorrectable. In some embodiments, the output (e.g., a decision sequence and one or more statistical information outputs) are input into a decoder to be decoded and error corrected to produce the recovered data. A sector is considered to be ECC uncorrectable when, for example, the decoder determines that the detector output is not sufficient to determine the code word. If the decoder determines that the disk sector is ECC uncorrectable, then control passes to 506. Otherwise, if the decoder determines that the disk sector is not ECC uncorrectable (i.e., ECC correctable), then process 500 ends.

At 506, parameters associated with the receiver are adjusted without using known data. Since the sector is determined to be ECC uncorrectable, neither a training sequence nor an ECC corrected data sequence can be used to adjust the parameters. In some embodiments, the statistical information outputs are used to choose one or more error events along the decision sequence. In some embodiments, the reliability information (e.g., statistical information outputs) associated with each error-event is utilized to determine those which have highest likelihood of being a real (near) error-events. For such events (those with the highest likelihood of being a real (near) error event), the detected sequence is assumed to be incorrect and, thus, gradients are formed for parameter updates which reflect this belief. The chosen one or more error events are then processed to produce adjustments (e.g., gradients) by which one or more parameters of the receiver are updated. In some embodiments, each error event is used to generate one set of parameter adjustments. In some embodiments, all the chosen error events are individually processed and their corresponding parameter adjustments are added together to produce aggregate parameter adjustments, which are then used to update the one or more parameters of the receiver.

At 508, a re-read operation associated with the sector is processed. Due to the determination that the sector was ECC uncorrectable, a re-read operation is requested (e.g., as part of an automatic testing procedure of the system). The sector is read again using the receiver whose one or more parameters have been adjusted at 506.

At 510, it is determined whether the sector is ECC uncorrectable using the receiver with adjusted parameters. In some embodiments, if the decoder still cannot decode the code word with the receiver with the adjusted parameters, then it is determined that the sector is still ECC uncorrectable and control passes to 506 (to begin another round of adjusting receiver parameters). Otherwise, if the decoder can now decode the code word, then it is determined that the sector is no longer ECC uncorrectable and process 500 ends.

Figure 6:
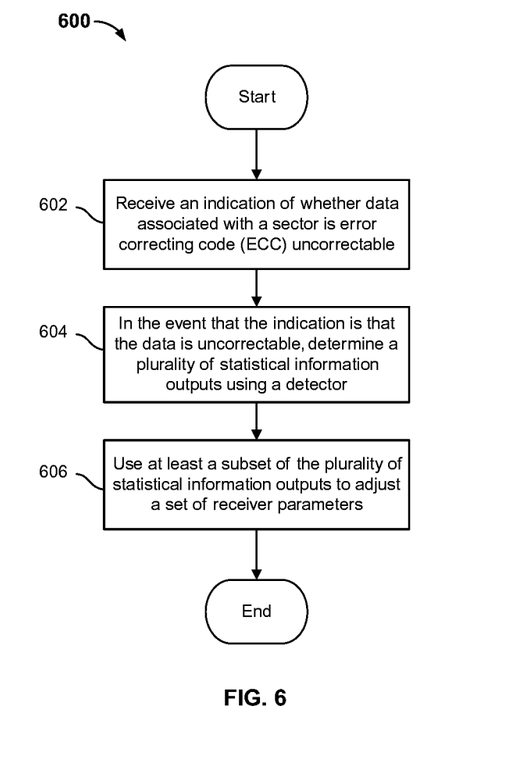
FIG. 6 is a flow diagram showing an embodiment of a process of adjusting system parameters without using known data.

FIG. 6 is a flow diagram showing an embodiment of a process of adjusting system parameters without using known data. In some embodiments, process 600 can be implemented, at least in part, by using system 400. In some embodiments, process 600 can be used to implement 502, 504, and 506 of process 500.

At 602, an indication of whether data associated with a sector is error correcting code (ECC) uncorrectable is received. In some embodiments, the sector is a portion of a hard disk. In some embodiments, the indication of whether data associated with a sector is ECC uncorrectable is produced by a decoder in response to a read operation associated with the sector of the hard disk. For example, the decoder can receive outputs from a receiver (e.g., a detector associated with the receiver) that include a decision sequence and perform a decoding process (e.g., using a low density parity check code or Turbo code) on the decision sequence. In the event that a code word cannot be determined from the decision sequence (or statistical information thereof), the decoder could produce an indication that data associated with the sector is ECC uncorrectable.

At 604, in the event that the indication is that the data is uncorrectable, a plurality of statistical information outputs is determined using a detector. In some embodiments, the detector used is a soft output Viterbi algorithm (SOVA) detector. In some embodiments, a statistical information output (e.g., $\Delta$) is one or more of the following: the difference between two path metrics associated with an instance in time of the trellis diagram, the difference between two path metrics associated with a state along the decision sequence, or the difference between two path metrics associated with two candidate sequences (e.g., one surviving path and one non-surviving path) considered by the SOVA detector. For example, the SOVA detector can be configured to produce $\Delta$s concurrently or subsequent to determining a decision sequence through a trellis diagram related to the Viterbi algorithm. In some embodiments, the plurality of statistical information is stored (e.g., temporarily).

At 606, at least a subset of the plurality of statistical information outputs is used to adjust a set of one or more receiver parameters. In some embodiments, the plurality of statistical information is used to determine one or more error events or events that are likely to be errors. For example, it is presumed that the magnitude of a $\Delta$ ($|\Delta|$) is inversely proportional to the probability that at a state associated with the $\Delta$ along the decision sequence in the trellis diagram, the path not selected (i.e., discarded) to that state was the correct path associated with the true/correct written/transmitted sequence. As such, $\Delta$s that are smaller are considered to be associated with events that are more likely to be error events (e.g., the selected branches to states associated with the $\Delta$s were actually not along the correct sequence associated with the true/correct written/transmitted data). This is particularly true in the event of an ECC uncorrectable sector, in which it is assumed that there exist a large number of errors passed to the decoder. In various embodiments, a subset of the plurality of statistical information outputs is chosen (e.g., based on the magnitude of $\Delta$) and processed. Different techniques can be used to process the events associated with the chosen $\Delta$s. Regardless of the techniques chosen to process the chosen events, the outputs of the processing include one or more adjustments to the set of one or more receiver parameters. For example, the one or more adjustments to the set of one or more receiver parameters can enable the receiver with the updated receiver parameter values (e.g., on a subsequent re-read of the sector or on a re-processing of the current read) to produce a decision sequence that is more likely to be the correct path and/or be more likely to be ECC correctable than a decision sequence produced prior to the adjustment to the receiver parameter values (e.g. thereby minimizing the bit error rate associated with the system).

Figure 7:
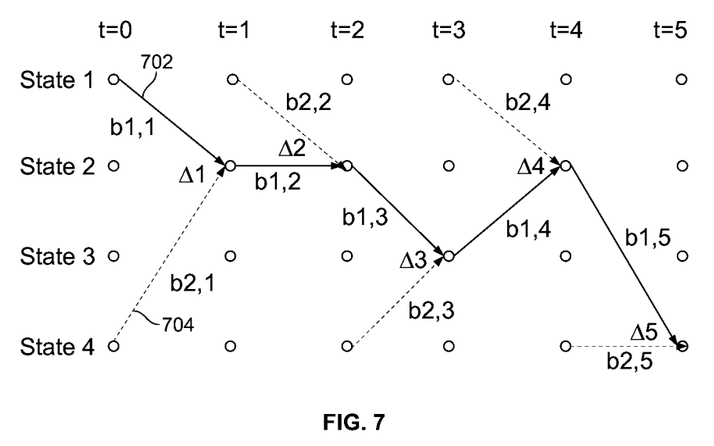
FIG. 7 is a diagram showing an embodiment of a portion of a trellis diagram related to the Viterbi algorithm.

FIG. 7 is a diagram showing an embodiment of a portion of a trellis diagram related to the Viterbi algorithm. In this example, four states (State 1, State 2, State 3, and State 4) and six time instances (t=0, 1, 2, 3, 4, and 5) are shown (although more or fewer states and time instances can exist for a trellis diagram). At time t=0, the output can be at any of the four states. At time t=1, the output can enter the same or another state, depending on the allowable transitions from the previous state. At t=2, the output can enter the same or another state, and so forth for time t=3, 4, and 5. For each state and each time instance, a path metric can be calculated. The path metrics can be used to select the sequence of states corresponding to the most likely input sequence (e.g., decision sequence). In some embodiments, an "add, compare, select" process is performed to select a sequence (e.g., the most likely input sequence) through a trellis diagram.

In this example, sequence 702 is the decision sequence across time t=0 to t=5. In some embodiments, a decision sequence is selected using an add, compare, and select process. In some embodiments, a branch metric is associated with a branch from a state at one time instance to a state at the next time instance. For example, a branch metric is associated with the branch (along the decision sequence in the example) from State 1 at t=0 to State 2 at t=1. In some embodiments, the branch metrics are the Euclidean distance or Hamming distance between the received symbol (e.g., either 0 or 1 bit) and the corresponding symbol to the branch. The branch metric can be thought of as the "distance" between what was received and all the possible channel symbols that could have been received for that state transition. In some embodiments, a state at each time instance is associated with a path metric. In some embodiments, the path metric of a sequence through the trellis diagram includes the branch metrics corresponding to the branches that comprise the sequence. In a process of add, compare, and select, if there is more than one path entering a given state at the next time instance, the path corresponding to the minimum path metric is selected. For example, the selected path can be referred to as a surviving path and a path that is not selected can be referred to as a non-surviving path. In this example, decision sequence 702 can be thought of as the surviving path through the shown trellis diagram.

In some embodiments, a statistical information output can be determined (and stored) for each state along a decision sequence. In some embodiments, a statistical information output can be described as the difference between the path metrics ($\Delta$) of two paths that lead to the same state along the decision sequence. In the example, the branch associated with State 1 at t=0 to State 2 at t=1 (which is along decision sequence 702) is associated with path metric $b_{1,1}$ (e.g., which is an aggregate of all the branch metrics associated with the path up to t=1). Also, the branch associated with State 4 at t=0 to State 2 at t=1 (which is not along decision sequence 702) is associated with path metric $b_{2,1}$ (e.g., which is an aggregate of all the branch metrics associated with the path up to t=1). Then, the difference in the path metrics associated with the two paths that lead to State 2 at t=1 (which is a state along decision sequence 702) can be written as $\Delta_1=b_{1,1}-b_{2,1}$, for example. Similarly, the difference in the path metrics associated with two paths (one along decision sequence 702 and another candidate path that was not along decision sequence 702) that lead to State 2 at t=2 (which is also a state along decision sequence 702) is $\Delta_2=b_{1,2}-b_{2,2}$. Similar calculations can be made for $\Delta_3$, $\Delta_4$, and $\Delta_5$ in the example. In some embodiments, a statistical information output (e.g., $\Delta$) is stored for each state along decision sequence 702. In this example, $\Delta_1$, $\Delta_2$, $\Delta_3$, $\Delta_4$, and $\Delta_5$ can be stored (e.g., temporarily) and examined and/or used to refer to the states along decision sequence 702 with which they are associated.

In some embodiments, the lower the magnitude of $\Delta$, the closer the two path metrics, and the lower the reliability of the decision to select the path associated with smaller path metric over the path associated with the larger path metric.

The Viterbi algorithm is implemented in various ways in various embodiments. Any appropriate trellis diagram can be constructed for recovering data encoded by various codes and/or channels.

Figure 8:
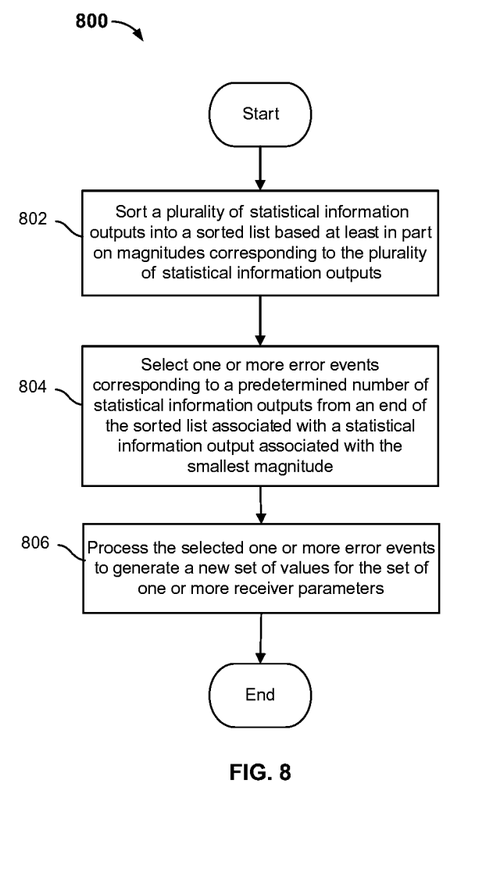
FIG. 8 is a flow diagram showing an embodiment of a process for selecting error events to be used for adjusting system parameters.

FIG. 8 is a flow diagram showing an embodiment of a process for selecting error events to be used for adjusting system parameters. In various embodiments, process 800 is performed subsequent to a determination that a disk sector for which data is to be recovered is ECC uncorrectable. In some embodiments, process 800 can be implemented, at least in part, by using system 400. In some embodiments, process 800 is used to adjust the one or more parameters associated with a receiver (e.g., read channel) of a hard disk system. In some embodiments, process 800 is used to implement, at least in part, 606 of process 600.

At 802, a plurality of statistical information outputs are sorted into a sorted list based at least in part on magnitudes corresponding to the plurality of statistical information outputs. In some embodiments, a (e.g., SOVA) detector associated with the system produces a plurality of statistical information outputs ($\Delta$s) associated with a decision sequence. For example, each statistical information output corresponds to a difference in path metrics (e.g., between two candidate paths through the trellis diagram) leading up to a state along the decision sequence. In some embodiments, the statistical information outputs are stored with information regarding the two path metrics and/or the corresponding state along the decision sequence. In some embodiments, the $\Delta$s are sorted such that $|\Delta_1|\leq|\Delta_2|\leq|\Delta_3| \ldots \leq|\Delta_N|$ (for N number of $\Delta$s).

At 804, one or more error events corresponding to a predetermined number of statistical information outputs from an end of the sorted list associated with a statistical information output associated with the smallest magnitude are selected. In some embodiments, a number (e.g., $N_{update}$) of statistical information outputs ($\Delta$s) to be taken from the sorted list (so that their corresponding events/states along the decision sequence can be processed) is configured (e.g., by an administrator in charge of adjusting the parameters of the receiver). For example, the subset of $\Delta_1$, $\Delta_2$, $\Delta_3$, $\ldots$, $\Delta_{Nupdate}$ from the end of the sorted list with the lowest magnitudes are selected for processing at 806. Each event selected by virtue of their selected corresponding $\Delta$ is assumed to be an error event (e.g., the selected path to the state associated with the $\Delta$ is assumed to not be associated with the correct sequence).

At 806, the selected one or more error events are processed to generate a new set of values for the set of one or more receiver parameters. In some embodiments, the technique assumes the events associated with the smallest $\Delta$'s (e.g., the selected $\Delta_1$, $\Delta_2$, $\Delta_3$, $\ldots$, $\Delta_{Nupdate}$) to be real error-events (i.e., the selected decision path is assumed to be not equivalent to the written/transmitted path). This assumption is justified by the fact that these events are the most probable locations of decision errors and by the fact that the sector is ECC uncorrectable (thus indicating a large number of decisions errors produced by the detector). In some embodiments, as a result of adjusting the receiver parameters with the generated adjustments, the receiver is enabled to output a decision sequence (e.g., for a subsequent re-read operation on the same sector) that is more likely to be the correct path (e.g., the bit error rate is reduced) and/or is more likely to be ECC correctable.

Figure 9:
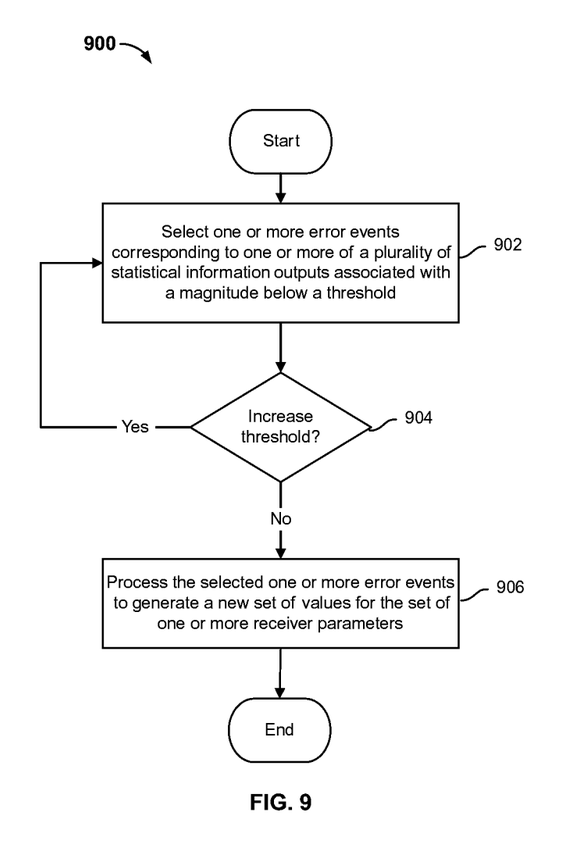
FIG. 9 is a flow diagram showing another embodiment of a process for selecting error events to be used for adjusting system parameters.

FIG. 9 is a flow diagram showing another embodiment of a process for selecting error events to be used for adjusting system parameters. In various embodiments, process 900 is performed subsequent to a determination that a disk sector for which data is to be recovered is ECC uncorrectable. In some embodiments, process 900 can be implemented, at least in part, by using system 400. In some embodiments, process 900 is used to adjust the one or more parameters associated with a receiver (e.g., read channel) of a hard disk system. In some embodiments, process 900 is used to implement, at least in part, 606 of process 600.

At 902, one or more error events corresponding to one or more of a plurality of statistical information outputs associated with a magnitude below a threshold are selected. In some embodiments, a (e.g., SOVA) detector associated with the system produces a plurality of statistical information outputs ($\Delta$s) associated with a decision sequence. For example, each statistical information output corresponds to a difference in path metrics (e.g., between two candidate paths through the trellis diagram) leading up to a state along the decision sequence. In some embodiments, the statistical information outputs are stored with information regarding the two path metrics and/or the corresponding state along the decision sequence.

In some embodiments, a threshold ($\overline{\propto}$) for $\Delta$s is configured (e.g., by an administrator in charge of adjusting the parameters of the receiver). The $\Delta$s with magnitudes that are below the $\overline{\propto}$ threshold are selected to be processed. Each event selected by virtue of their selected corresponding $\Delta$ is assumed to be an error event (e.g., the selected path to the state associated with the $\Delta$ is assumed to not be associated with the correct sequence).

At 904, it is determined whether the threshold needs to be increased. In some embodiments, $\overline{\propto}$ can be raised (e.g., reconfigured) if insufficient $\Delta$s are selected to be processed at 902. Choosing the initial $\overline{\propto}$ is a balance between the desire to select enough $\Delta$s to process such that the receiver parameters can be meaningfully adjusted and the desire to not select too many $\Delta$s such that the computation of all the selected events would be intractable. However, if the initial $\overline{\propto}$ does not permit a sufficient (e.g., configured quantity) of $\Delta$s to be selected for processing, then the $\overline{\propto}$ can be raised and the selection process can be repeated at 902.

At 906, the selected one or more error events are processed to generate a new set of values for the set of one or more receiver parameters. In some embodiments, a processing technique uses the events (assumed to be error events) that are associated with the selected $\Delta$s (which are below threshold $\overline{\propto}$) to generate parameter adjustments to the one or more receiver parameters of the system. In some embodiments, as a result of adjusting the receiver parameters with the generated adjustments, the receiver is enabled to output a decision sequence (e.g., for a subsequent re-read operation on the same sector) that is more likely to be the correct path (e.g., the bit error rate is reduced) and or is more likely to be ECC correctable.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   receiving an indication of whether data associated with a sector is error correcting code (ECC) uncorrectable;
   in the event that the indication is that the data is uncorrectable, determining a plurality of statistical information outputs using a detector; and
   using at least a subset of the plurality of statistical information outputs to adjust a set of one or more receiver parameters.

2. The method of claim 1, wherein determining a plurality of statistical information outputs comprises determining a plurality of statistical information outputs without known data.

3. The method of claim 1, wherein a statistical information output is associated with a state along a decision data sequence.

4. The method of claim 1, wherein a statistical information output is associated with a time instance along a decision data sequence.

5. The method of claim 1, wherein the set of one or more receiver parameters are associated with a read channel of a hard disk system.

6. The method of claim 1, wherein an indication that data associated with a sector is ECC uncorrectable is received from a decoder.

7. The method of claim 1, wherein the sector is associated with a hard disk.

8. The method of claim 1, wherein a sector is ECC uncorrectable comprises a sector associated with one or more unreadable bits.

9. The method of claim 1, wherein at least one of the plurality of statistical information outputs corresponds to an error event associated with a detection process.

10. The method of claim 1, wherein using a subset of the plurality of statistical information outputs includes:
    sorting the plurality of statistical information outputs into a sorted list based at least in part on magnitudes corresponding to the plurality of statistical information outputs;
    selecting one or more error events corresponding to a predetermined number of statistical information outputs from the end of the sorted list associated with a statistical information output associated with the smallest magnitude; and
    processing the selected one or more error events to generate a new set of values for the set of one or more receiver parameters.

11. The method of claim 1, wherein using a subset of the plurality of statistical information outputs includes:
    selecting one or more error events corresponding to one or more of the plurality of the statistical information outputs associated with a magnitude below a threshold; and
    processing the selected one or more error events to generate a new set of values for the set of one or more receiver parameters.

12. The method of claim 1, the set of one or more receiver parameters includes at least one of is the following: a parameter associated with an equalizer, a parameter associated with a pattern dependent finite impulse response (FIR) filter, a parameter associated with a soft-output Viterbi algorithm detector.

13. A system, comprising:
    a processor configured to:
       receive an indication of whether data associated with a sector is error correcting code (ECC) uncorrectable;
       in the event that the indication is that the data is uncorrectable, determine a plurality of statistical information outputs using a detector; and
       use at least a subset of the plurality of statistical information outputs to adjust a set of one or more receiver parameters; and
    a memory coupled to the processor and configured to provide the processor with instructions.

14. The system of claim 13, wherein to determine a plurality of statistical information outputs comprises the processor configured to determine a plurality of statistical information outputs without known data.

15. The system of claim 13, wherein a statistical information output is associated with a state along a decision data sequence.

16. The system of claim 13, wherein a statistical information output is associated with a time instance along a decision data sequence.

17. The system of claim 13, wherein at least one of the plurality of statistical information outputs corresponds to an error event associated with a detection process.

18. The system of claim 13, wherein to use a subset of the plurality of statistical information outputs includes the processor configured to:
    sort the plurality of statistical information outputs into a sorted list based at least in part on magnitudes corresponding to the plurality of statistical information outputs;
    select one or more error events corresponding to a predetermined number of statistical information outputs from the end of the sorted list associated with a statistical information output associated with the smallest magnitude; and
    process the selected one or more error events to generate a new set of values for the set of one or more receiver parameters.

19. The system of claim 13, wherein to use a subset of the plurality of statistical information outputs includes the processor configured to:
    select one or more error events corresponding to one or more of the plurality of the statistical information outputs associated with a magnitude below a threshold; and
    process the selected one or more error events to generate a new set of values for the set of one or more receiver parameters.

20. A non-transitory computer program product, the computer program product being embodied in a computer readable medium and comprising computer instructions for causing a processor to perform a method comprising:
    receiving an indication of whether data associated with a sector is error correcting code (ECC) uncorrectable;
    in the event that the indication is that the data is uncorrectable, determining a plurality of statistical information outputs using a detector; and using at least a subset of the plurality of statistical information outputs to adjust a set of one or more receiver parameters.

* * * * *

UNITED STATES PATENT AND TRADEMARK OFFICE
CERTIFICATE OF CORRECTION

PATENT NO.        : 8,560,900 B1
APPLICATION NO.   : 13/160360
DATED             : October 15, 2013
INVENTOR(S)       : Bellorado et al.

Page 1 of 1

It is certified that error appears in the above-identified patent and that said Letters Patent is hereby corrected as shown below:

In the claims

In column 12, line 2, claim 12, after "of", delete "is"

Signed and Sealed this
First Day of March, 2016

Michelle K. Lee
*Director of the United States Patent and Trademark Office*